(12) United States Patent
Blais et al.

(10) Patent No.: US 8,621,727 B2
(45) Date of Patent: Jan. 7, 2014

(54) TRAY HOLDER

(75) Inventors: Alain Blais, Bromont (CA); Julie Croteau, Bromont (CA); Michel Robert, Bromont (CA); Christian Bedard, Bromont (CA)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 13/232,095

(22) Filed: Sep. 14, 2011

(65) Prior Publication Data

US 2012/0102682 A1  May 3, 2012

(30) Foreign Application Priority Data

Oct. 29, 2010 (CA) ...................................... 2718863

(51) Int. Cl.
*B65D 67/02* (2006.01)
*F16B 2/20* (2006.01)

(52) U.S. Cl.
USPC .............. 24/555; 206/499; 206/509; 206/701

(58) Field of Classification Search
USPC ......... 24/545, 555, 570, 457; 206/307.1, 710, 206/449, 451, 711, 712, 701, 499, 509, 511, 206/719; 211/126.1
See application file for complete search history.

(56) References Cited

U.S. PATENT DOCUMENTS

| | | | |
|---|---|---|---|
| 5,421,455 A | 6/1995 | Clatanoff et al. | |
| 5,492,223 A | 2/1996 | Boardman et al. | |
| 5,584,717 A | 12/1996 | Radde et al. | |
| 5,794,784 A | 8/1998 | Murphy | |
| 6,079,565 A | 6/2000 | Walsh et al. | |
| 6,445,174 B1 | 9/2002 | Koh et al. | |
| 6,474,475 B1 | 11/2002 | Bjork | |
| 6,612,442 B2 | 9/2003 | Soh et al. | |
| 6,627,483 B2 | 9/2003 | Ondricek et al. | |
| 6,877,194 B2 * | 4/2005 | Bradley et al. ................. | 24/570 |
| 7,086,562 B2 | 8/2006 | Peterson et al. | |
| 7,574,784 B2 * | 8/2009 | Pylant et al. ................... | 24/570 |

(Continued)

FOREIGN PATENT DOCUMENTS

JP   2000025831 A   *   1/2000   ............. B65D 67/02

OTHER PUBLICATIONS http://www.eco-tech.com/trays.shtml, "Sell Request Form—Trays", Sep. 8, 2011.

(Continued)

*Primary Examiner* — James Brittain
(74) *Attorney, Agent, or Firm* — Ian D. MacKinnon; Kevin B. Anderson

(57) ABSTRACT

A clip to secure trays in a stack including a platform, rails coupled to the platform to mate with tabs of at least bookending trays in the tray stack when the platform occupies a brake position thereof relative to the stack and an elastic brake element coupled to the platform and configured to be biased against the stack when the platform occupies the brake position to increase a mating friction between the rails and the tabs, the elastic brake element being actuatable against the bias to permit selective movement of the platform to and from the brake position, the selective movement solely actuating the elastic brake element.

18 Claims, 5 Drawing Sheets

(56) References Cited

U.S. PATENT DOCUMENTS

| | | |
|---|---|---|
| 2004/0020666 A1 | 2/2004 | Catlin |
| 2004/0179931 A1 | 9/2004 | Peterson et al. |
| 2005/0072714 A1 | 4/2005 | Eleveld |
| 2008/0006705 A1 * | 1/2008 | Furunishi ............... 235/494 |
| 2008/0038097 A1 | 2/2008 | Kim et al. |
| 2008/0075575 A1 | 3/2008 | Lee et al. |
| 2008/0229560 A1 | 9/2008 | Pylant et al. |

OTHER PUBLICATIONS http://productsearch.machinedesign.com/FeaturedProducts/Detail/KeystoneElectronics/AntiStatic_Integrated_Circuit_Tray_Clip/46728/1 "Keystone Electronics Corp.—Anti-Static Integrated Circuit Tray Clip", Sep. 8, 2011.

http://texastechnologies.com/semiconductor-handling-supplies/jedec-trays.htm, "Jedec Matrix Trays", Sep. 8, 2011.

* cited by examiner

TRAY HOLDER

CROSS REFERENCE TO RELATED APPLICATION

The present application claims the benefit of priority to a Canadian Patent Application Serial Number 2718863 entitled "TRAY HOLDER", filed Oct. 29, 2010 with the Canadian Intellectual Property Office, the content of which is incorporated herein by reference in its entirety.

BACKGROUND

Aspects of the present invention are directed to a tray holder and, more particularly, a holder for Joint Electron Devices Engineering Council (JEDEC) tray manipulation.

Integrated circuit (IC) manufacturing processes use trays as the transport media to protect sensitive electronic devices from mechanical and electrostatic damage that may occur in typical manufacturing of IC devices. These processes take stacks of trays containing IC devices as input and output and require manual handling of stacks of trays between process steps and in and out of in-process storage.

Common methods of handling stacks of trays containing IC devices presently include the use of individual or loose trays where the operator grabs stacks of 6-14 trays without any device to restrain the trays in the stack to transport the same from station to station. This technique runs the risk of operator error where trays come unstacked. Stainless steel baskets may be used where the operator stacks trays with IC devices in a stainless steel basket to transport the same from station to station. Metal baskets are typically required to withstand the thermal environment of some process steps, making them too heavy for routine tray stack handling. Extruded C-clips cut to length to bind two trays together have been used.

An additional system involves the use of banding straps where the operator bands a stack of trays together using a secure bundle of trays to transport the IC devices from station to station. The use of a band which is buckled about the trays is not user friendly, however, in preparing the bundle or unbundling for single tray access. In particular, straps are often made of a plastic material and they may be applied at a remote strapping machine to tray stacks between each process operation (i.e., many times during production flow). The straps are then cut and removed at each operation. As such, a number of manipulations associated with strapping operations may be significant, the use of plastics and the inability to reuse the straps is ecologically unsustainable and tray contamination and scratch damage due to the strapping leads to tray deterioration.

In view of these issues, a further system for securing trays in a stack was proposed in U.S. Pat. No. 5,421,455, in which a clip attaches individual trays in a stack, the trays being formed for nesting and with end tabs located on the opposite ends of the trays. According to the '455 patent, the clip included a platform having a front and a rear surface and a leading and trailing edge, a plurality of spaced rails positioned parallel with each other positioned on the rear surface of the platform, the rails having a generally T-shape in cross-section, an end stop projecting from the trailing edge of the platform in a rearward direction for limiting the movement of the platform across the end of the stack of trays and latch means. The latch means were formed on the platform for locking the platform onto the end of a stack of trays and include a stop projecting in a rearward direction, biasing means to normally position the stop in a position projecting rearward from the rear surface of the platform and actuating means for moving the stop against said biasing means to move the stop from the rearward projecting position to a position in the plane of said rear surface.

Since the actuating means are operable in a manner that is separate from the movement of the platform relative to the stack of trays, however, the connection of the clip to the stack of trays and the disconnection of the clip involves a two-step process whereby the user manipulates the platform and the actuating means separately and at the same time. That is, in order for the clip to be connected to a stack of trays, it is necessary for the user to move the platform along the tray ends and, at the same time, to pull the actuating means such that the stop does not project rearwardly. By contrast, in order for the clip to be disconnected, the actuating means must be pulled again such that the stop does not project rearwardly and such that the platform movement is permitted. These operations are unnecessarily complicated, time consuming and expensive.

SUMMARY

In accordance with an aspect of the invention, a clip to secure trays in a stack is provided and includes a platform, rails coupled to the platform to mate with tabs of at least bookending trays in the tray stack when the platform occupies a brake position thereof relative to the stack and an elastic brake element coupled to the platform and configured to be biased against the stack when the platform occupies the brake position to increase a mating friction between the rails and the tabs, the elastic brake element being actuatable against the bias to permit selective movement of the platform to and from the brake position, the selective movement solely actuating the elastic brake element.

In accordance with another aspect of the invention, a clip to secure nestable trays in a stack is provided and includes a platform, a plurality of rails protruding from the platform to engage with tray tabs to prevent movement of the platform relative to tray ends in first and second transverse directions, an edge stop projecting from the platform to limit movement of the platform across the tray ends in a third direction transverse to the first and second directions, a brake to inhibit movement of the platform relative to a tray stack and an elastic element to bias the brake toward the tray stack to increase friction of the slider and tab engagements, the brake including leading and trailing edge cams that permit movement of the platform across the tray ends in the third direction by encouraging movement of the brake against the bias during such platform movement.

In accordance with another aspect of the invention, a clip to secure nestable trays in a stack is provided and includes a platform having front and rear surfaces and leading and trailing edges, a plurality of rails protruding from the rear surface to engage with tray tabs to prevent movement of the platform relative to tray ends in first and second transverse directions, an edge stop projecting from the trailing edge to limit movement of the platform across the tray ends in a third direction transverse to the first and second directions beyond a brake position, a brake to inhibit movement of the platform relative to a tray stack and an elastic element to bias the brake rearward from a platform plane to increase friction of the rail and tab engagements with the platform occupying the brake position, the brake including leading and trailing edge cams that permit movement of the platform to/from the brake position across the tray ends in the third direction by encouraging movement of the brake against the bias during such platform movement.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 1:
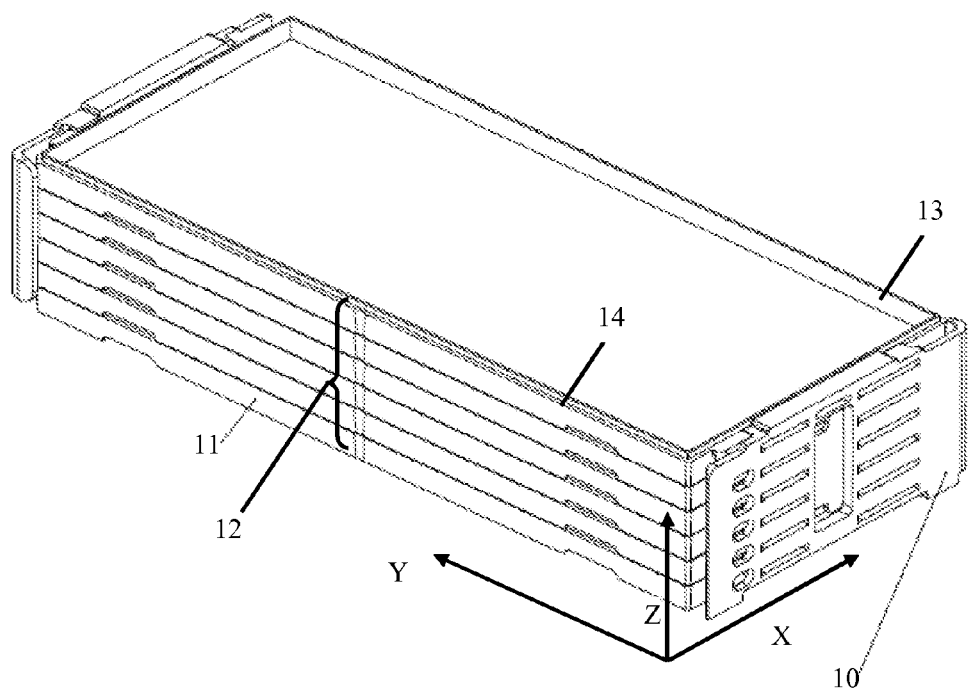
FIG. 1 is a perspective view of a clip to secure nestable trays in a stack.
Figure 2:
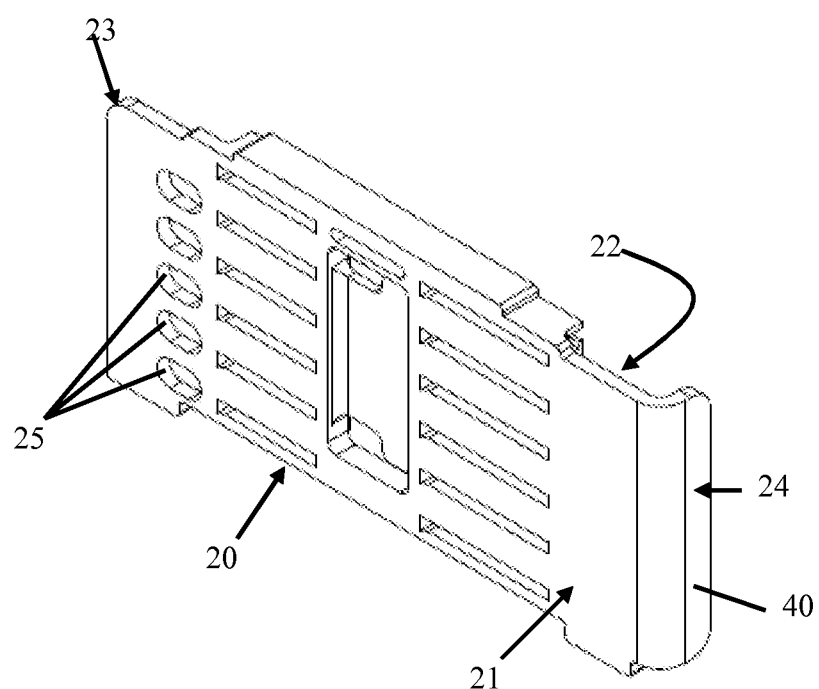
FIG. 2 is a perspective view of the clip of FIG. 1.
Figure 3:
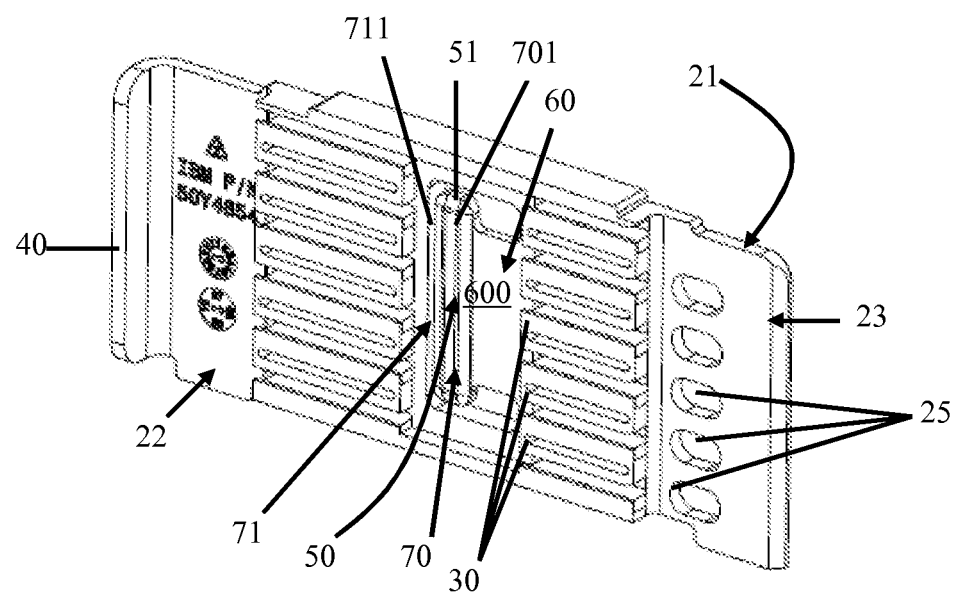
FIG. 3 is a perspective view of the clip of FIGS. 1 and 2 from a different angle.
Figure 4:
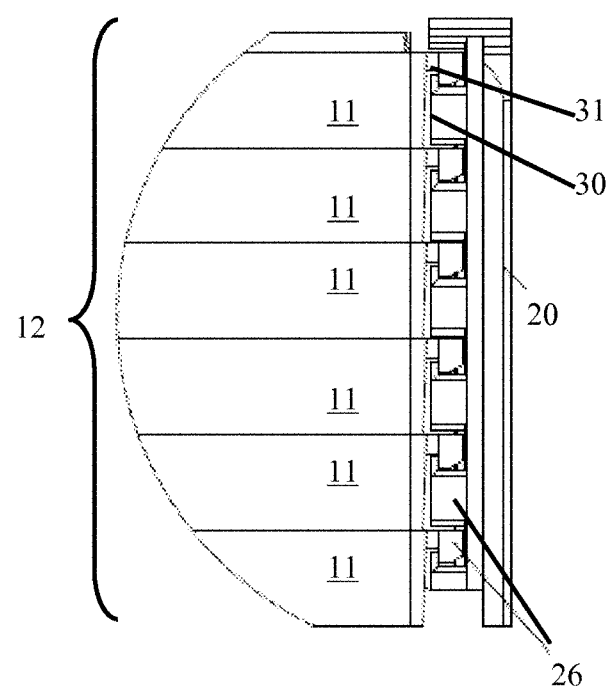
FIG. 4 is an enlarged side view of the clip and the nestable trays of FIG. 1.

With reference to FIGS. 1-4, a clip 10 to secure nestable trays 11 in a stack 12 is provided. The trays 11 are nestable with one another and, in particular, may be Joint Electron Devices Engineering Council (JEDEC) trays. Where the trays 11 are JEDEC trays, they may be configured to support integrated circuit (IC) devices in rows and columns across the widths of the trays and they may substantially conform to the JEDEC standard for thick trays. That is, the trays 11 may be about 0.480 inches (12.2 mm) high, 5.35 inches wide, and 12.4 inches long with end tray tabs 31 to be described below that increase the total length to about 12.70 inches. Each nestable tray 11 may be formed with a lip 13 inset from the tray edge and extending around the upper edge of the nestable tray 11, and with a recess 14 along the lower edge of the tray about its periphery such that the trays are readily stacked or nested with the lip on one engaging the recess of the next adjacent upper tray to retain the trays from shifting longitudinally or laterally in relationship to each other.

The clip 10 includes a platform 20 having a front surface 21, a rear surface 22 opposing the front surface 21, a leading edge 23 and a trailing edge 24 opposing the leading edge 23. The platform 20 further includes a plurality of rails 30, an edge stop 40, a brake 50 and an elastic element 60. The rails 30 may be coupled to and may protrude from the rear surface 22 to engage with the tray tabs 31 of at least the top-most and the bottom-most trays 11 in the stack 12 (i.e., the bookending trays) to prevent movement of the platform 20 relative to the stack 12 generally or the tray ends in particular in first and second transverse directions, such as directions X and Z as shown in FIG. 1. It is to be understood that the rails 30 may engage with the tray tabs 31 of each tray 11 in the stack 12 not just the bookending trays.

The edge stop 40 may project from the trailing edge 24 to limit movement of the platform 20 across the stack 12 in a third direction, such as the direction Y as shown in FIG. 1, which is transverse to the first and second directions beyond a brake position. The edge stop 40 may also be positioned on the rails 30 as well or another portion of the platform 20 as long as it is disposed to limit the movement of the platform 20 in the third direction.

At least two or more rails 30 may be provided for each nestable tray 11 in the stack 12. In particular, each rail 30 pair may be disposed on either side of the brake 50. In this way, a torsional moment about the brake 50 may be limited by the rails 30 on either side of the brake 50. Also, the tray tabs 31 and the rails 30 may each have substantially L-shaped complementary cross-sections and the platform 20 and the edge stop 40 may have respective lengths to extend substantially along an entire thickness of the stack 12.

The brake 50 inhibits movement of the platform 20 relative to the tray stack 12 and the elastic element 60 biases the brake 50 in a rearward direction from a plane of the platform 20 to thereby increase friction of the rail 30 and tab 31 engagements when the platform 20 occupies the brake position. The brake 50 may include a bulbous member 51 and leading and trailing edge cams 70 and 71, having tapered and/or curved surfaces 701, 711, respectively, that permit movement of the platform 20 to/from the brake position across the stack 12 in the third direction by encouraging movement of the brake 50 against the bias provided by the elastic element 60 during such platform 20 movement. The elastic element 60 may include a planar member 600 with the brake 50 disposed at a distal edge thereof. With this arrangement, a size of the bulbous member 51 and a length of the elastic element 60 may be provided such that the bulbous member 51 never protrudes from a plane of the forward surface 21 of the platform 20.

For a stack 12 of nestable trays 11, the platform 20 may be slid across tray ends in a direction which is substantially parallel to a longitudinal axis of the platform 20 as defined from the leading edge 23 to the trailing edge 24 such that the rails 30 slideably engage with the tray tabs 31. This engagement prevents movement of the platform 20 into and away from the stack 12 and along a thickness direction of the stack 12, as the rails 30 and the tray tabs 31 each may have the substantially L-shaped complementary cross sections 26. It is to be understood that the rails 30 and the tray tabs 31 need not have substantially L-shaped cross-sections and that the sliding of the platform 20 need not be in the direction described above. In fact, the rails 30 and the tray tabs 31 may have any complementary shapes and the movement of the platform 20 may be in any direction in accordance with those shapes.

As the sliding progresses, the leading edge cam 70 of the brake 50 comes into contact with the near ends of the near-side tray tabs 31 such that the curvature or the taper of the leading edge cam 70 relatively smoothly absorbs the impact of the brake 50 with the near ends and, as the sliding progresses further, the leading edge cam 70 causes, in opposition to the bias of the elastic element 60, the brake 50 to move away from the tray ends in, for example, the Y direction, as shown in FIG. 1. Then, as the brake 50 clears the near-side tray tabs 31, the trailing edge cam 71 slides over the far ends of the near-side tray tabs 31 and allows for the return of the brake 50 to its normal position with the sliding continuing until the platform 20 occupies the brake position and the edge stop 40 abuts the stack 12 to prevent any further sliding. At this point, the brake 50 abuts the stack 12 in opposition to the bias of the elastic element 60 such that friction of the rail 30 and tab 31 engagements is increased sufficiently to prevent unselective movement of the platform out of the brake position.

By contrast, when the platform 20 is to be removed from the brake position, the platform 20 may be slid in the reverse direction. In this case, the trailing edge cam 71 of the brake 50 comes into contact with the far ends of the near-side tray tabs 31 such that the curvature or the taper of the trailing edge cam 71 relatively smoothly absorbs the impact of the brake 50 with the far ends of the near-side tray tabs 31 and, as the sliding progresses further, the trailing edge cam 71 causes, in opposition to the bias of the elastic element 60, the brake 50 to move away from the tray ends in, for example, the Y direction, as shown in FIG. 1. Then, as the brake 50 clears the near-side tray tabs 31, the leading edge cam 70 slides over the near ends of the near-side tray tabs 31 and allows for the return of the brake 50 to its normal position with the sliding continuing until the platform 20 is completely removed from the stack 12.

The size and shape of the elastic element 60 must therefore be provided such that the bias provided by the elastic element 60 to the brake 50 is sufficient to maintain the platform in the brake position until, for example, a user selectively moves the platform out of the brake position. That is, the bias must increase the friction generated by the engagement of the rails 30 and the tray tabs 31 such that unselective sliding of the platform 20 is prevented. By the same token, the bias must permit the selective movement of the platform 20 by the user and therefore must not be excessively rigid.

The platform 20 is formed to define windows 25 through which the nestable trays 11 in the stack 12 are at least partially visible. In this way, the contents of the stack 12 are observable and determined without disassembly or removal of any of the individual trays.

Figure 5:
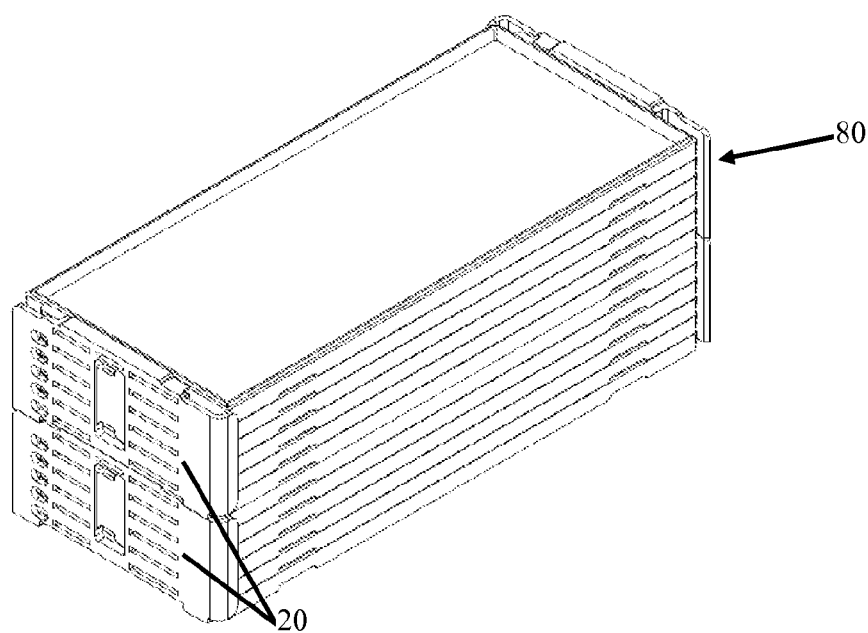
FIG. 5 is a perspective view of nested clips to form a tray pile.
Figure 6:
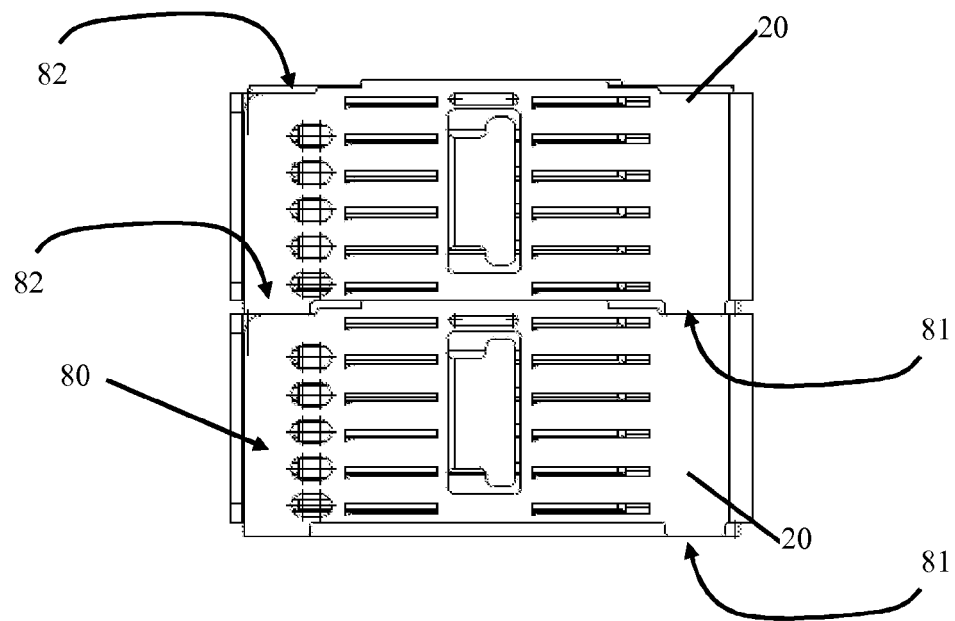
FIG. 6 is a plan view of the nested clips of FIG. 5.

With reference to FIGS. 5 and 6, the platform 20 is nestable with another platform 20 to form a tray stack pile 80. As shown, the platform 20 includes complementary legs 81 and grooves 82. The legs 81 protrude from a bottom surface of the platform 20 and the grooves 82 are recessed from a top surface of the platform 20. With this configuration, when stacked, the platforms 20 are retained from shifting longitudinally or laterally in relationship to each other.

In accordance with various embodiments, the platform 20 may be formed of a molded thermoplastic material. Similarly, the rails 30, the edge stop 40 and the elastic element 60 may be integrally formed with the platform 20. The brake 50 may be integrally formed with the elastic element 60.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A clip to secure trays in a stack, comprising:
   a platform, wherein the platform is nestable with an additional platform;
   rails coupled to the platform to mate with tabs of at least bookending trays in the tray stack when the platform occupies a brake position thereof relative to the stack; and
   an elastic brake element coupled to the platform and configured to be biased against the stack when the platform occupies the brake position to increase a mating friction between the rails and the tabs,
   the elastic brake element being actuatable against the bias to permit selective movement of the platform to and from the brake position, the selective movement solely actuating the elastic brake element.

2. The clip according to claim 1, wherein the platform is substantially flat and has opposing forward and rear surfaces, the rear surface facing the stack, and opposing leading and trailing edges relative to the selective movement.

3. The clip according to claim 1, wherein the platform is formed to define windows through which the stacked trays are at least partially visible.

4. The clip according to claim 1, wherein the rails have L-shaped cross sections and the tabs have complementary L-shaped cross-sections.

5. The clip according to claim 1, further comprising an edge stop coupled to the platform to confirm the brake position.

6. The clip according to claim 5, wherein the platform and the edge stop extend along a thickness of the stack.

7. The clip according to claim 1, wherein the elastic brake element comprises:
   a planar member coupled to the platform; and
   a brake disposed at a distal edge of the planar member, the brake including a brake portion and tapered portions on opposite leading and trailing sides of the brake portion relative to respective directions of the selective movement to and from the brake position.

8. The clip according to claim 7, wherein the brake comprises leading and trailing edge cams at the tapered portions.

9. A clip to secure nestable trays in a stack, the clip comprising:
   a platform, wherein the platform is nestable with another platform to form a tray stack pile, the platform comprising complementary legs and grooves, the legs protruding from a bottom surface thereof and the grooves being recessed from a top surface thereof;
   a plurality of rails protruding from the platform to engage with tray tabs to prevent movement of the platform relative to tray ends in first and second transverse directions;
   an edge stop projecting from the platform to limit movement of the platform across the tray ends in a third direction transverse to the first and second directions;
   a brake to inhibit movement of the platform relative to a tray stack; and
   an elastic element to bias the brake toward the tray stack to increase friction of the slider and tab engagements,
   the brake including leading and trailing edge cams that permit movement of the platform across the tray ends in the third direction by encouraging movement of the brake against the bias during such platform movement.

10. The clip according to claim 9, wherein the platform is formed to define windows through which the trays in the tray stack are at least partially visible.

11. The clip according to claim 9, wherein a number of the rails is provided such that at least two rails engage with tabs of each tray in the tray stack.

12. The clip according to claim 9, wherein the tabs and the rails each have complementary L-shaped cross-sections.

13. The clip according to claim 9, wherein the platform and the edge stop extend along a thickness of the tray stack.

14. The clip according to claim 9, wherein the brake comprises a bulbous member and the leading and trailing edges comprise curved surfaces.

15. The clip according to claim 9, wherein the brake remains recessed from a front face of the platform during the movement of the platform across the tray ends in the third direction.

16. The clip according to claim 9, wherein the elastic element comprises a planar member, the brake being disposed at a distal edge thereof.

17. The clip according to claim 9, wherein the platform is formed of a molded thermoplastic material, the rails, the edge stop and the elastic element being integrally formed with the platform and the brake being integrally formed with the elastic element.

18. A clip to secure nestable trays in a stack, the clip comprising:
- a platform having front and rear surfaces and leading and trailing edges, wherein the platform is nestable with an additional platform;
- a plurality of rails protruding from the rear surface to engage with tray tabs to prevent movement of the platform relative to tray ends in first and second transverse directions;
- an edge stop projecting from the trailing edge to limit movement of the platform across the tray ends in a third direction transverse to the first and second directions beyond a brake position;
- a brake to inhibit movement of the platform relative to a tray stack; and
- an elastic element to bias the brake rearward from a platform plane to increase friction of the rail and tab engagements with the platform occupying the brake position,
- the brake including leading and trailing edge cams that permit movement of the platform to/from the brake position across the tray ends in the third direction by encouraging movement of the brake against the bias during such platform movement.

\* \* \* \* \*